(12) United States Patent
Sie et al.

(10) Patent No.: US 11,715,639 B2
(45) Date of Patent: Aug. 1, 2023

(54) SEMICONDUCTOR DEVICE AND FABRICATION METHOD THEREFOR

(71) Applicant: TAIWAN SEMICONDUCTOR MANUFACTURING COMPANY, LTD., Hsinchu (TW)

(72) Inventors: Yuan-Chun Sie, Toufen (TW); Po-Yi Tseng, Taichung (TW); Chien-Hao Chen, Chuangwei Township (TW); Ching-Lun Lai, Taichung (TW); David Sung, Hsinchu (TW); Ming-Feng Hsieh, New Taipei (TW); Yi-Chi Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 55 days.

(21) Appl. No.: 15/701,680

(22) Filed: Sep. 12, 2017

(65) Prior Publication Data
US 2018/0151372 A1     May 31, 2018

Related U.S. Application Data

(60) Provisional application No. 62/427,756, filed on Nov. 29, 2016.

(51) Int. Cl.
*H01L 21/28* (2006.01)
*H01L 29/66* (2006.01)
*H01L 29/78* (2006.01)

(52) U.S. Cl.
CPC .. *H01L 21/28008* (2013.01); *H01L 21/28035* (2013.01); *H01L 29/66545* (2013.01); *H01L 29/66795* (2013.01); *H01L 29/785* (2013.01); *H01L 29/7848* (2013.01)

(58) Field of Classification Search
CPC ...................................................... H01L 21/306
See application file for complete search history.

(56) References Cited

U.S. PATENT DOCUMENTS

| 5,688,719 A * | 11/1997 | Tsai | G03F 7/40 |
| | | | 257/E21.218 |
| 5,868,833 A * | 2/1999 | Habuka | C30B 25/02 |
| | | | 117/84 |
| 6,626,994 B1 * | 9/2003 | Kimura | C30B 15/203 |
| | | | 117/13 |

(Continued)

FOREIGN PATENT DOCUMENTS

| CN | 103594349 | 2/2014 |
| CN | 104115255 | 10/2014 |
| CN | 105428299 | 3/2016 |

OTHER PUBLICATIONS

Office Action dated Apr. 2, 2021 for corresponding case No. CN 201711020152.8 (pp. 1-11).

(Continued)

*Primary Examiner* — Aaron J Gray
*Assistant Examiner* — Christopher A Culbert
(74) *Attorney, Agent, or Firm* — Hauptman Ham, LLP

(57) ABSTRACT

A method of manufacturing a semiconductor structure includes depositing a silicon layer over a substrate, removing a portion of the silicon layer to form a gate stack, and performing a hydrogen treatment on the gate stack to repair a plurality of voids in the stack structure.

20 Claims, 11 Drawing Sheets

(56) References Cited

U.S. PATENT DOCUMENTS

| | | | |
|---|---|---|---|
| 9,852,938 B1* | 12/2017 | Chan | H01L 29/7317 |
| 10,002,939 B1* | 6/2018 | Cheng | H01L 29/4238 |
| 2002/0001892 A1* | 1/2002 | Kim | H01L 29/66545 |
| | | | 257/E21.507 |
| 2008/0283900 A1* | 11/2008 | Nakagawa | H01L 27/105 |
| | | | 257/321 |
| 2010/0327248 A1* | 12/2010 | Khoueir | H01L 43/12 |
| | | | 257/E47.001 |
| 2014/0011303 A1* | 1/2014 | Meng | H01L 29/66477 |
| | | | 438/8 |
| 2014/0024214 A1* | 1/2014 | Kim | H01L 21/02697 |
| | | | 438/675 |
| 2016/0027893 A1* | 1/2016 | Kwon | H01L 29/513 |
| | | | 257/411 |
| 2016/0043186 A1 | 2/2016 | Liu et al. | |
| 2016/0190124 A1* | 6/2016 | Lee | H01L 27/088 |
| | | | 438/197 |
| 2017/0033013 A1* | 2/2017 | Kim | H01L 21/823431 |

OTHER PUBLICATIONS

Office Action dated Jul. 13, 2021 for corresponding case No. TW 11020667820. (pp. 1-7).

* cited by examiner

US 11,715,639 B2

SEMICONDUCTOR DEVICE AND FABRICATION METHOD THEREFOR

PRIORITY CLAIM

The instant application is a non-provisional application claiming priority to Provisional Application No. 62/427,756, filed Nov. 29, 2016, the entire content of which is incorporated by reference herein.

BACKGROUND

Amorphous silicon, also referred to as α-Si, is a material applied in various electronic devices such as field effect transistors, solar cells, thin film transistors, image sensors, and micro-electro-mechanical systems.

During a fabrication of fin field effect transistors (fin-FETs), a gate stack initially includes amorphous silicon and/or polycrystalline silicon (poly silicon). After various processes associated with the fin field effect transistors are performed, the amorphous silicon and/or poly silicon is subsequently removed and replaced with a conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
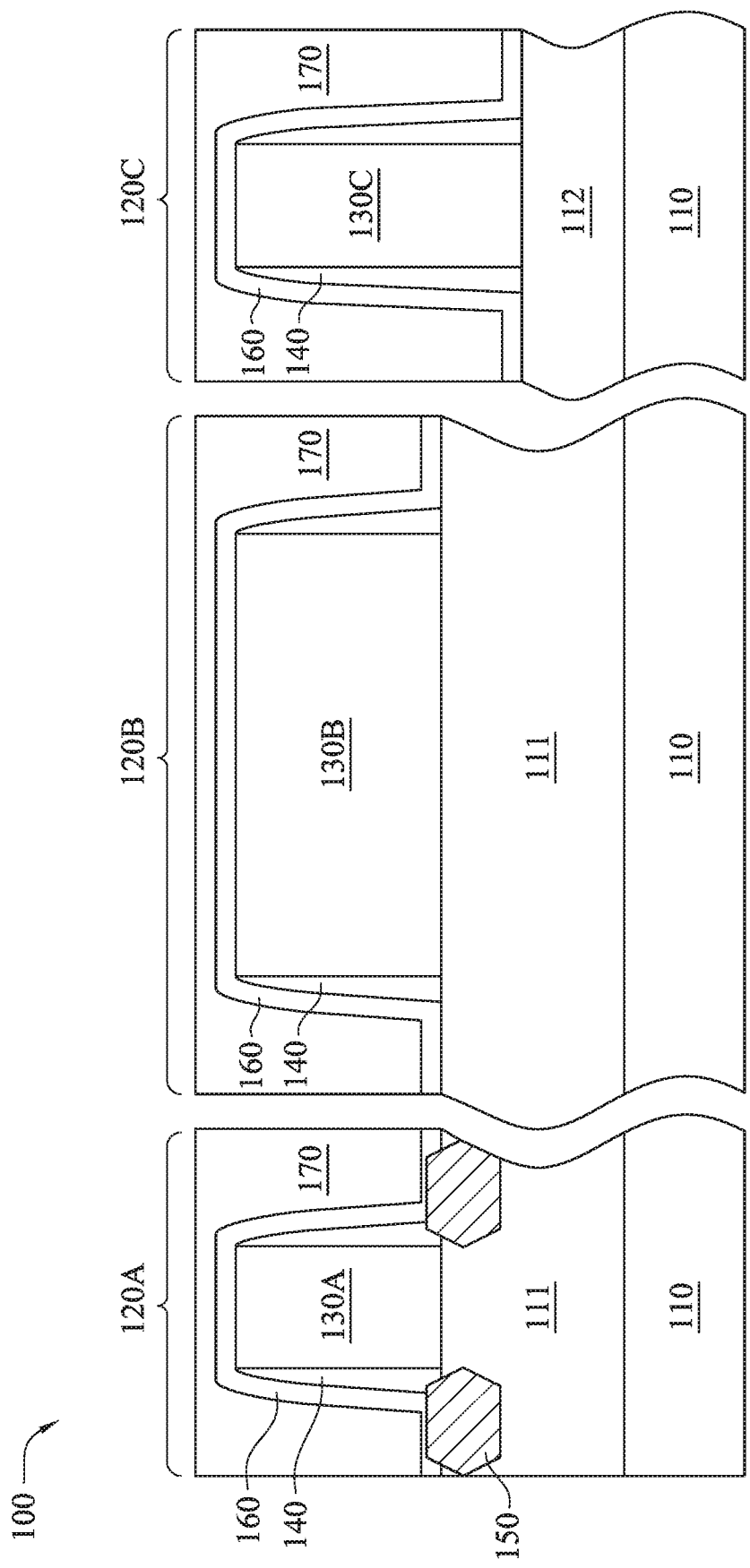
FIG. 1 is a cross-sectional view of a semiconductor device having a silicon layer in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

The integrated circuit (IC) industry has experienced rapid growth. Technological advances in semiconductor materials and design have produced generations of ICs where each new generation has smaller and more complex circuits than the previous generation. An amorphous silicon or a poly silicon is widely used to fabricate active components and passive components for various circuit designs including memory, oscillators, current limitation resistance, electrostatic discharge (ESD) protection or impedance matching. In some instances, a resistor is fabricated by doping an amorphous silicon stack to realize a target resistance. Although using amorphous silicon or poly silicon reduces a manufacturing cost, the electrical properties become more sensitive as geometrical dimensions of devices shrink. For example, a plurality of protrusions from material around the amorphous silicon fill in voids of the amorphous silicon. These protrusions increase deviations between an intended function of the devices and an actual performance of the devices. A hydrogen treatment is performed to induce migration of silicon atoms in order to repair voids before the formation of gate spacers. In such a way, uniformity of electrical properties of devices formed using the hydrogen treatment is improved, thereby increasing a production yield, in comparison with devices which are formed without the hydrogen treatment.

FIG. 1 is a cross-sectional view of a semiconductor device 100 in accordance with one or more embodiments. Semiconductor device 100 includes a substrate 110, a first component 120A, a second component 120B, a third component 120C (collectively referred to as components 120), multiple gate stacks 130A-130C (collectively referred to as gate stacks 130), spacers 140, source/drain features 150, an etch stop layer 160 and an inter-layer dielectric (ILD) 170. Semiconductor device 100 further includes a plurality of fin structures 111 extending from substrate 110. An isolation structure 112 is adjacent fin structure 111. In some embodiments, at least one isolation structure 112 is between adjacent fin structures 111. Fin structures 111 are arranged in parallel in a first direction and isolation structure 112 isolates fin structures 111 in the first direction. In some embodiments, isolation structure 112 isolates two fin structures 111 in a second direction perpendicular to the first direction. In at least one embodiment, isolation structure 112 is referred to as a shallow trench isolation (STI) feature. Isolation structure 112 includes a dielectric material, such as silicon oxide, silicon nitride or another suitable material. A top surface of fin structures 111 is above a top surface of isolation structure 112.

Substrate 110 includes a bulk semiconductor material, such as silicon, germanium, silicon-germanium, silicon-carbide, III-V compounds or another suitable material. In some embodiments, substrate 110 is a silicon on insulator layer (SOI) substrate or a silicon on sapphire (SOS) substrate. In some embodiments, substrate 100 includes a same material as fin structure 111. In some embodiments, substrate 100 includes a different material from fin structure 111.

In some embodiments, first component 120A is referred to as an active component, such as a finFET, second component 120B is referred to as a first passive component, such as a capacitor, and third component 120C is referred to as a second passive component, such as a resistor. First component 120A and second component 120B are over fin structure 111 and third component 120C is over isolation structure 112. In some embodiments, first component 120A and second component 120B are over a same fin structure 111. In some embodiments, first component 120A and second component 120B are over different fin structures 111. One of ordinary skill in the art would recognize that third component 120C is over fin structure 111, in some instances. For example, in some embodiments where the second passive component is a resistor, third component 120C extends over both fin structure 111 and isolation structure 112. In some embodiments, additional components, such as a diode, a bipolar junction transistor, a tri-gate field effect transistor, a gate-all-around field effect transistor, a fuse or an inductor, is over substrate 110 according to various integrated circuit (IC) design requirements. One of ordinary skill in the art would understand that in some embodiments where components 120 are planar components, components 120 are formed directly over a top surface of substrate 110.

Gate stacks 130 are over fin structures 111 and isolation structure 112. In some embodiments, each gate stack 130 includes multiple layers, such as a dielectric layer, a noncrystalline layer and a hard mask layer. In some embodiments, the dielectric layer includes a silicon oxide layer. In some embodiments, the noncrystalline layer includes an amorphous silicon layer, an amorphous silicon-germanium layer or an amorphous germanium layer. In some embodiments, the hard mask includes a silicon nitride layer and an oxide layer, for example, a plasma-enhanced oxide (PEOX). As another example, each gate stack 130 includes a polycrystalline layer, such as a poly silicon layer or a poly silicon-germanium layer. In some embodiments, each gate stack 130 includes a single layer, such as an amorphous silicon layer or a polysilicon layer. A top surface of each gate stack 130 is co-planar to each other gate stack top surface. In some embodiments where each gate stack 130 includes multiple layers, a thickness of the silicon layer of third component 120C is greater than a thickness of the silicon layer of first component 120A or second component 120B because the top surface of fin structure 111 is above the top surface of isolation structure 112. In some embodiments, each gate stack 130 includes a same materials as each other gate stack. In some embodiments, at least one gate stack 130 includes a different material from at least one other gate stack 130.

Spacers 140 are over substrate 110 and along sidewalls of gate stacks 130. Spacers 140 have a D-shape, an I-shape or an L-shape in order to define lightly doped drain (LDD) regions to help avoid hot carrier injection (HCI). In some embodiments, spacers 140 include a single dielectric layer, such as silicon oxide, silicon nitride, silicon oxynitride or another suitable material. In some embodiments, spacers 140 include multiple dielectric layers, for example, an oxide-nitride-oxide (ONO) structure. Based on various requirements of LDD regions, a thickness of spacers 140 ranges from about 100 angstroms (Å) to about 500 Å. A greater or smaller thickness of spacers 140 results in a deviation of device performance, in some instances.

At least a portion of source/drain features 150 is in fin structure 111 and at opposite sides of gate stack 130A. In some embodiments, source/drain features 150 are an n-type doped region or a p-type doped region over fin structure 111. In some embodiments, source/drain features 150 are an epitaxial material, such as silicon germanium or silicon carbide, grown in a recess in fin structure 111. The epitaxial material is configured to exert compressive/tensile stress to a channel region of first component 120A in order to improve a carrier mobility. In some embodiments, source/drain features 150 are a doped epitaxial material.

Etch stop layer 160 is over and along fin structure 111, isolation structure 112, gate stacks 130, spacers 140 and source/drain features 150. In some embodiments, etch stop layer 160 is also referred to as a contact etch stop layer (CESL). Etch stop layer 160 includes a material having a different etch selectivity from a subsequently formed dielectric material, such as ILD 170. In some embodiments, etch stop layer 160 includes a single dielectric layer, such as a silicon nitride layer, a silicon oxynitride layer, a silicon carbonitride, silicon boron nitride or another suitable material. In some embodiments, etch stop layer includes multiple dielectric layers, such as a combination of a silicon carbide layer and a silicon carbonitride layer.

ILD 170 is over etch stop layer 160 and surrounds gate stacks 130. ILD 170 is also referred to as an ILD0. In some embodiments, ILD 170 includes a single dielectric layer, such as silicon oxide, silicon nitride, undoped silicate glass (USG), Boro-Silicate Glass (BSG), tetraethyl orthosilicate (TEOS) or another suitable dielectric material. In some embodiments, ILD 170 includes a low dielectric constant (low-k) material, for example, a dielectric constant lower than 3. In some embodiments, ILD 170 includes an extreme low-k (ELK) material, for example, a dielectric constant lower than 2.6. In some embodiments, ILD 170 includes multiple dielectric layers, such as USG and BSG.

Figure 2:
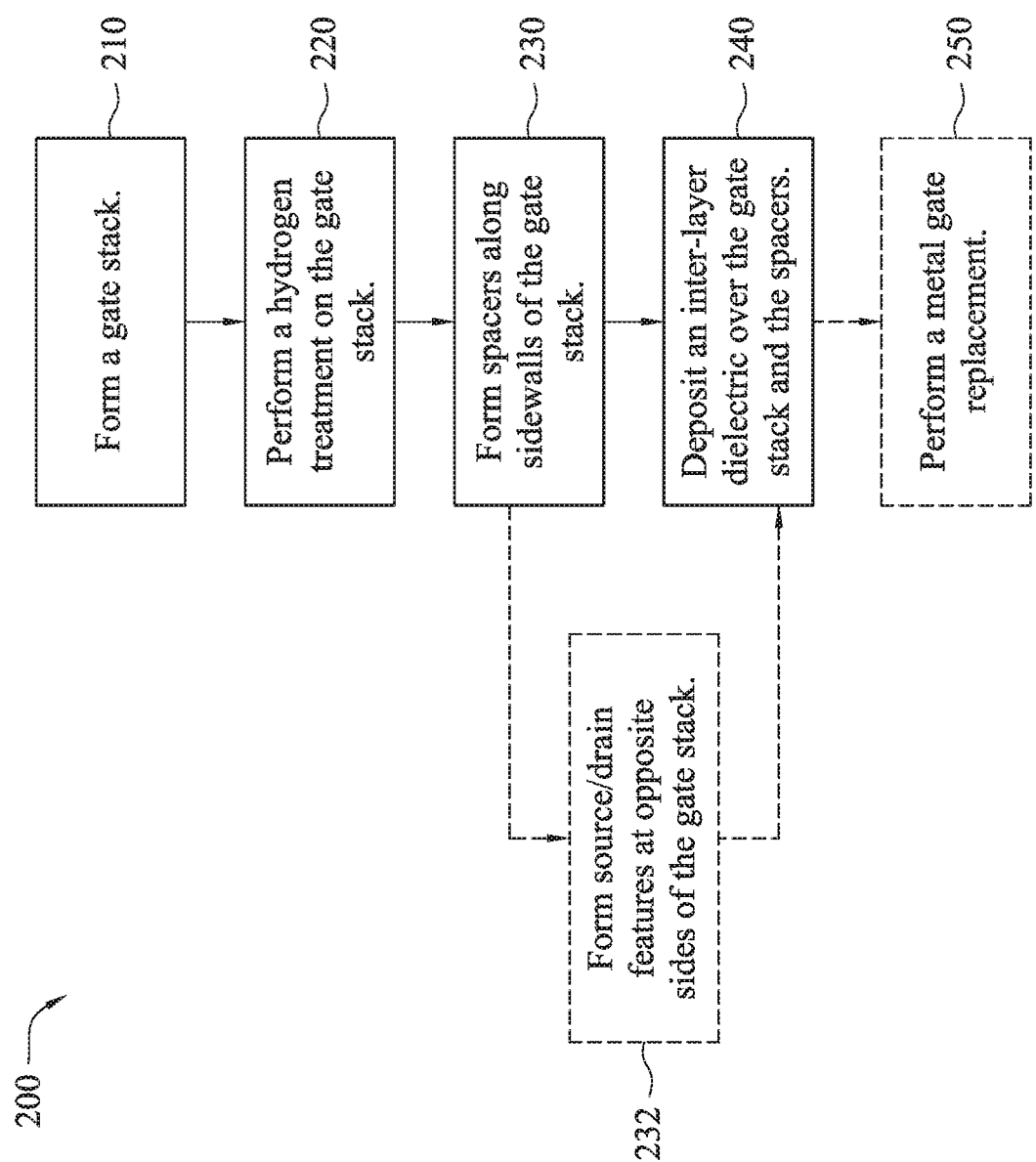
FIG. 2 is a flow chart of a method of manufacturing a semiconductor device in accordance with one or more embodiments.

FIG. 2 is a flowchart of a method 200 of manufacturing a semiconductor device in accordance with one or more embodiments. One of ordinary skill in the art would understand that additional operations are able to be performed before, during, and/or after method 200 depicted in FIG. 2, in some instances.

Method 200 includes operation 210 in which a gate stack is formed, e.g., gate stacks 130A-C in FIG. 1. A sacrificial layer is formed over a substrate, e.g., substrate 110 in FIG. 1. In some embodiments, a blanket sacrificial layer is formed over fin structure(s) and isolation structure(s). The sacrificial layer is also formed surrounding the fin structures. The formation of the sacrificial layer includes a deposition process, such as chemical vapor deposition (CVD), or another suitable method. The sacrificial layer includes amorphous silicon, poly silicon, amorphous germanium, combinations thereof or another suitable material. In some embodiments where the sacrificial layer includes silicon, defects such as voids are generated within the sacrificial layer and at a surface of the sacrificial layer. The defects form because not all silicon atoms in the sacrificial layer are fourfold coordinated, i.e., each silicon atom shares each of its four valence electrons with each of four neighboring atoms, so some silicon atoms have dangling bonds. In some embodiments where the sacrificial layer includes amorphous silicon, voids are generated from distorted silicon-silicon bonds. In some embodiments where the sacrificial layer is crystalline, defects such as Schottky divacancy or Frenkel divacancy are generated because of unstable electrical neutrality. In some embodiments, voids are generated or even exacerbated during a subsequent etch process. The voids exposed after an etch process will be filled with a dielectric material using a subsequent deposition process, reducing operational performance of the semiconductor device. In some embodiments, a planarization process, such as chemical mechanical polish (CMP), is performed after the formation of the sacrificial layer. In some embodiments, after the planarization process, a thickness of the sacrificial layer ranges from about 150 nanometers (nm) to about 200 nm.

A gate dielectric layer is formed between the substrate and the sacrificial layer. The formation of the dielectric layer includes a thermal oxidation, a deposition process, such as atomic layer deposition (ALD), or combinations thereof. In some embodiments, the gate dielectric layer includes silicon oxide, silicon nitride, combinations thereof or another suitable material. In some embodiments, the gate dielectric layer includes a high-k dielectric material, such as hafnium oxide, hafnium silicate, hafnium tantalum oxide, hafnium zirconate, titanium oxide, zirconium oxide, zirconium silicate or combinations thereof. Based on various dielectric materials being used, a thickness of the gate dielectric layer ranges from about 10 angstroms (Å) to about 50 Å.

In some embodiments, a hard mask layer is formed over the sacrificial layer. The formation of the hard mask layer includes a deposition process, such as CVD or physical vapor deposition (PVD). The hard mask layer includes silicon oxide, silicon nitride, silicon oxynitride, silicon carbide, combinations thereof or another suitable material. In at least one embodiment, the hard mask layer includes a silicon nitride layer and a PEOX layer over the silicon nitride layer. A thickness of the PEOX layer ranges from about 60 nm to about 120 nm, and a thickness of the silicon nitride layer ranges from about 10 nm to about 30 nm. A greater thickness of the hard mask layer reduces a gate height of a transistor, resulting in an insufficient stress to a channel region, in some instances. A smaller thickness of the hard mask layer increases a risk of patterning failure, in some instances. Subsequently, a portion of the hard mask layer is patterned by a photolithography process and removed by an etch process. At least one gate stack is formed over the fin structure and/or the isolation structure.

Method 200 continues with operation 220 in which a hydrogen treatment is performed on the gate stack. In order to reduce the voids at a surface of the gate stack, a hydrogen-containing material is used to induce migration of, for example, silicon atoms to repair silicon-silicon bonds. The hydrogen treatment includes an annealing process or a plasma treatment. In some embodiments where the hydrogen treatment is an annealing process, a chamber temperature is raised to a temperature ranging from about 400 degrees Celsius to about 1200 degrees Celsius. A higher temperature increases risk of damage to the gate stack, in some instances. A lower temperature is not sufficient to cause migration of silicon atoms, in some instances. A duration for the annealing process ranges from about 5 seconds to about 1 hour. A longer duration increases risk of damage to the gate stack, in some instances. A shorter duration is not sufficient to repair silicon-silicon bonds, in some instances. One of ordinary skill in the art would understand that the duration is associated with the temperature. For example, a higher temperature is processed with a shorter duration than a lower temperature.

In some embodiments where a low pressure hydrogen treatment is performed, a hydrogen-containing gas, such as hydrogen, triatomic hydrogen or silane(s), is used under a pressure ranging from about 50 Torr to about 150 Torr. In some embodiments where an atmospheric pressure hydrogen treatment is performed, the hydrogen-containing gas, such as hydrogen with a concentration from about 1% to about 10%, is used under about 760 Torr. In some embodiments where the hydrogen treatment is a plasma treatment, a radio frequency (RF) power is controlled in a range from about 200 watts to about 800 watts for a duration ranging from about 5 seconds to about 300 seconds. A greater RF power or a longer duration increases risk of damage to the gate stack, in some instances. A smaller RF power or a shorter duration is not sufficient to repair bonds, in some instances.

Method 200 continues with operation 230 in which spacers, e.g., spacers 140 in FIG. 1, are formed along sidewalls of the gate stack. In some embodiments, an LDD implantation process is performed prior to the formation of the spacers. The formation of the spacers includes a deposition process and an etch process. The spacers include one or more dielectric materials, such as silicon oxide, silicon nitride, silicon oxynitride, silicon carbide or another suitable material. In some embodiments when the spacers include silicon oxide and silicon nitride, the etch process includes an anisotropic etching, for example, a dry etching using difluoromethane and/or tetrafluoromethane as etchant gas to pattern the silicon oxide and silicon nitride. Next, a horizontal portion of the deposited materials is removed while the vertical portions along sidewalls of the gate stack remain to have an L shape or a D shape. An interface between the spacer and the gate stack is substantially free of protrusions extending from the spacers into the gate stack because the voids are repaired by the hydrogen treatment. A material of these protrusions is determined by an innermost portion of the spacers. For example, the protrusions include silicon nitride when the spacers are made of silicon nitride. As another example, the protrusions include silicon oxide when the spacers have the ONO structure. In some embodiments, the spacers include a liner layer directly in contact with the gate stack and a portion of the fin structure and/or the isolation structure.

Method 200 continues with optional operation 232 in which source/drain features, e.g., source/drain features 150 in FIG. 1, are formed at opposite sides of the gate stack, e.g., gate stack 130A in FIG. 1. In some embodiments where the source/drain features are used to apply a strain to a channel region of the transistor, portions of fin structures are removed to form recesses adjacent to the spacers. The recesses are entirely within the fin structure. In some embodiments where the transistor is a planar transistor, recesses are formed by removing portions of the substrate. The formation of the recesses includes an etch process, such as a wet etching or a dry etching. Next, an epitaxial (epi) growth is performed by filling the recesses with one or more semiconductor materials. The semiconductor materials are selected based on a conductivity type of the transistor. In some embodiments, the source/drain features are independently formed in a hybrid process of the epi growth and an implantation process. In some embodiments, the source/drain features are independently formed by using an implantation process. Following the formation of the source/drain features, a silicidation process is performed to silicide a top portion of the source/drain features. In some embodiments, the source/drain features are formed after the gate replacement process.

Method 200 continues with operation 240 in which an inter-layer dielectric (ILD), e.g., ILD 170 in FIG. 1, is formed over the gate stack and spacers. Before the formation of the ILD, an etch stop layer is conformally formed over the gate stack, the spacers, the source/drain features and the fin structure. The etch stop layer is used to protect the underlying gate stack and the source/drain features during a formation of a contact opening. The formation of the etch stop layer includes a deposition process, such as CVD, PVD or ALD. The etch stop layer includes a dielectric material, such as a silicon nitride layer, a silicon oxynitride layer, a silicon carbonitride, silicon boron nitride or another suitable material. In some embodiments, the etch stop layer applies a stress to the channel region of the transistor by a using a strained material.

Afterward, the ILD is formed over the etch stop layer and between the gate stacks. The formation of the ILD includes a deposition process, such as CVD, PVD, high density plasma (HDP), spin-on deposition (SOD), ALD or another suitable process. The ILD includes a dielectric material such as silicon oxide, silicon nitride, USG, BSG, TEOS, other suitable materials, and/or combinations thereof. Based on a gate height of the gate stack, the ILD has a thickness ranging from about 90 nm to about 500 nm. A greater thickness increases a manufacturing cost and processing time, in some instances. A smaller thickness results in an insufficient coverage of the gate stack. The formation of the ILD is followed by a planarization process, such as a CMP process, an etch process, or another suitable process to remove excess portions of the ILD and produce a planar top surface for the ILD. In some embodiments where the gate stack includes a sub-hard mask layer, an entirety of the hard mask layer and an upper portion of the spacers are removed during the planarization process. The sacrificial material, such as amorphous silicon, acts as a planarization stop layer. The planar top surface helps increase precision for a subsequent lithography process.

Method 200 continues with optional operation 250 in which a gate replacement process is performed. In some embodiments, based on various IC design requirements, a conductive material is used during a gate replacement process to improve the resistance-capacitance (RC) product. In some embodiments, the gate replacement process is also referred to as a gate last process. The remaining sacrificial material is completely removed by using an etch process to form a trench between the spacers. The sidewalls of the spacers are substantially smooth after the removal process. In some embodiments, the gate dielectric layer is also removed by a same or a different etch process. Next, an interfacial layer and a high-k dielectric layer is formed in the trench. The formation of the high-k dielectric layer includes a deposition process, such as ALD, CVD, thermal oxidation or another suitable process. The interfacial layer is used to improve an interface between a silicon surface, e.g., the fin structure, and the high-k dielectric layer. The interfacial layer includes silicon oxide, silicon oxynitride or another suitable material. A thickness of the interfacial layer ranges from about 3 Å to about 10 Å. A greater thickness reduces spacing for the high-k dielectric layer, in some instances. A smaller thickness increases the manufacturing difficulty, in some instances.

Subsequently, the trench is filled with a work function layer and a filling metallic layer. The formation of the work function layer and the filling metallic layer includes a deposition process, such as PVD, ALD, CVD or another suitable process. The work function layer is selected based on the conductivity of the transistor. For example, in an n-type transistor, the work function layer includes tungsten, cobalt, chromium, hafnium, tantalum, tantalum nitride, aluminum, titanium or molybdenum; in a p-type transistor the work function layer includes tungsten, cobalt, chromium, ruthenium oxide, tungsten nitride, iridium or platinum. In some embodiments, the work function layer has a U shape and is between the high-k dielectric layer and the filling metallic layer. The filling metallic layer includes tungsten, aluminum, copper or another suitable material.

In some embodiments, additional operations are included in method 200, such as a well region implantation based on various functions of the active component or the passive component. As another example, a formation of a barrier or protection including titanium nitride or tantalum nitride is formed before the formation of the sacrificial material. In some embodiments, an order of operations for method 200 is modified. For example, the formation of the metal gate is performed prior to the deposition of the ILD. In some embodiments, multiple operations for method 200 are performed simultaneously. For example, in some embodiments operation 210 and operation 220 are performed simultaneously, i.e., the hydrogen treatment is an in-situ process during the formation of the gate stack.

Figure 3A:
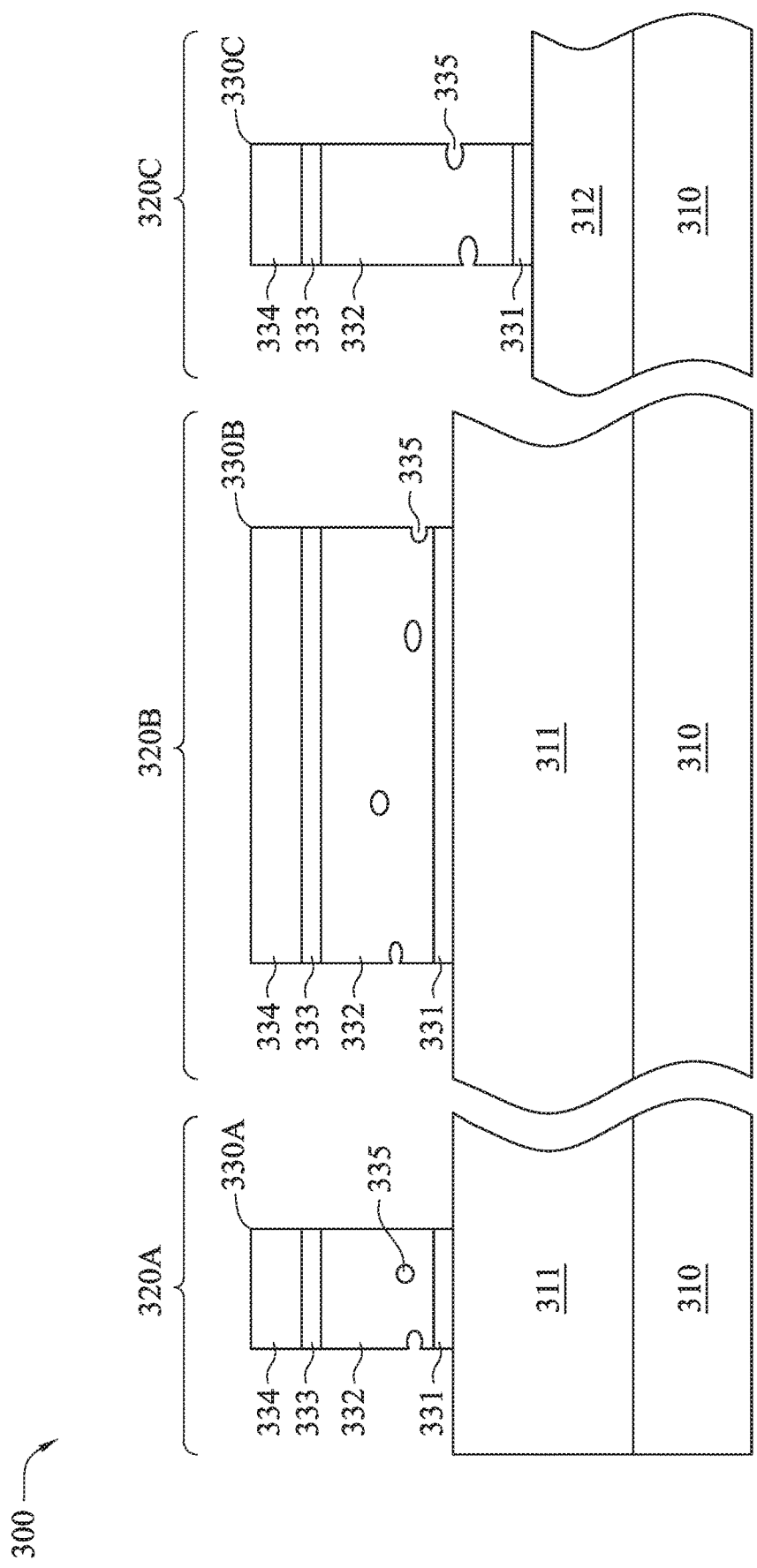
FIGS. 3A-3F are cross-sectional views at various stages of manufacturing a semiconductor device in accordance with one or more embodiments.

FIGS. 3A-3F are cross-sectional views at various stages of manufacturing a semiconductor device 300 in accordance with one or more embodiments. Semiconductor device 300 includes elements similar to semiconductor device 100 and a last two digits of like elements are the same. FIG. 3A is a cross-sectional view of semiconductor device 300 following operation 210. Semiconductor device 300 includes a substrate 310, a fin structure 311, an isolation structure 312, a first component 320A, a second component 320B and a third component 320C (collectively referred to as components 320). In at least one embodiment, first component 320A is a finFET, second component 320B is a capacitor and third component 320C is a resistor. Each component 320 includes a gate stack 330A/B/C (collectively referred to as gate stack 330), and each gate stack 330 includes a gate dielectric layer 331, a silicon layer 332, a silicon nitride 333 and an oxide layer 334. A thickness of silicon layer 332 in third component 320C is greater than a thickness of silicon layer 332 in first component 320A because a top surface of fin structure 311 is above a top surface of isolation structure 312. A top surface of each gate stack 330 is co-planar to each other gate stack top surface. In some embodiments, silicon layer 332 includes amorphous silicon. In some embodiments, silicon layer includes polysilicon. In some embodiments, gate stack 330 includes germanium, for example, silicon layer 332 is replaced by a germanium layer. During a deposition and/or an etch process of silicon layer, voids 335 are generated on a surface of silicon layer 332 and/or in silicon layer 332.

Figure 3B:
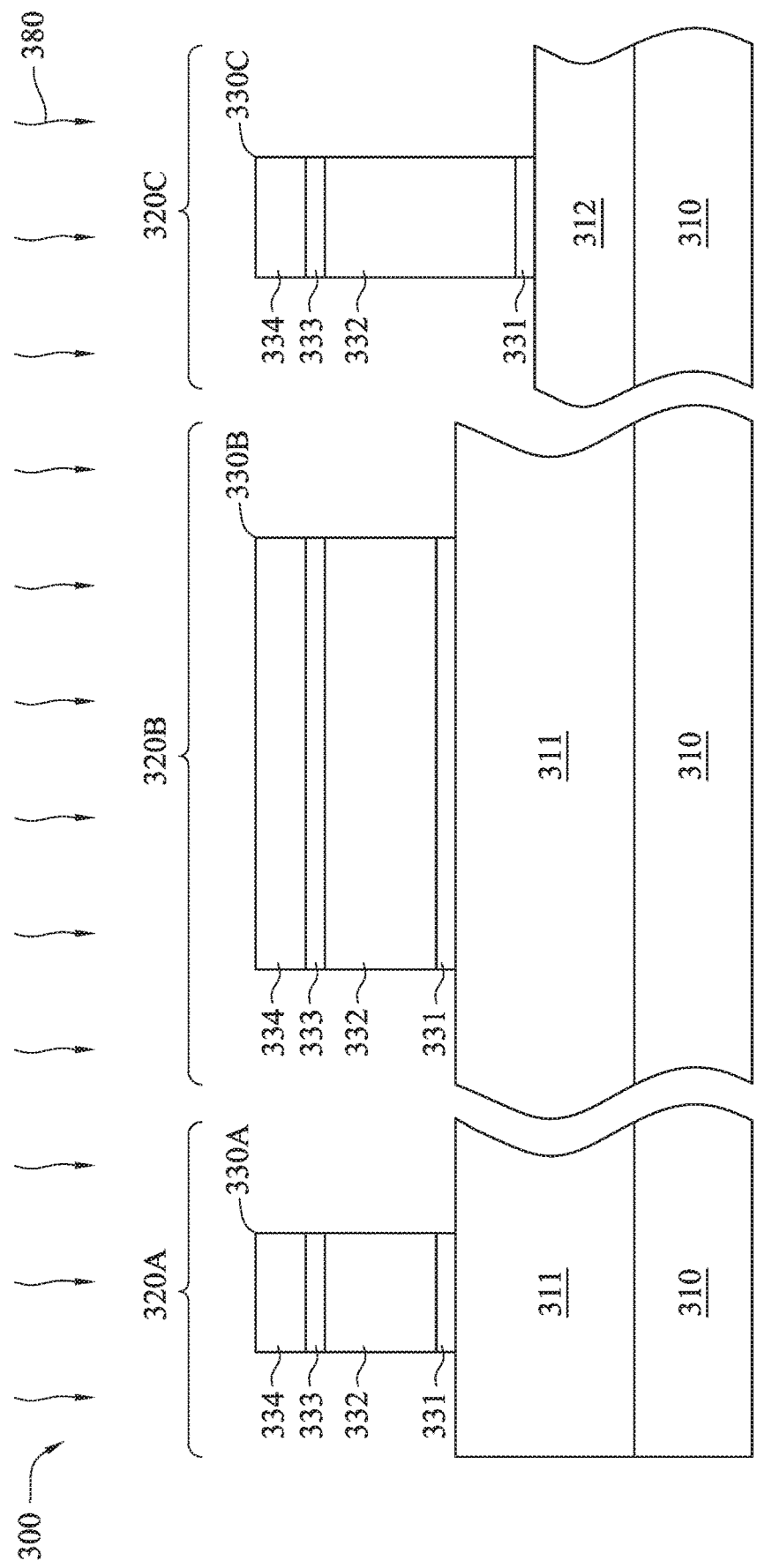

FIG. 3B is a cross-sectional view of semiconductor device 300 following operation 220. A hydrogen treatment 380 is performed to cause migration of silicon atoms and repair voids 335. Sidewalls of gate stacks 330 are substantially free of voids and smooth after hydrogen treatment 380.

Figure 3C:
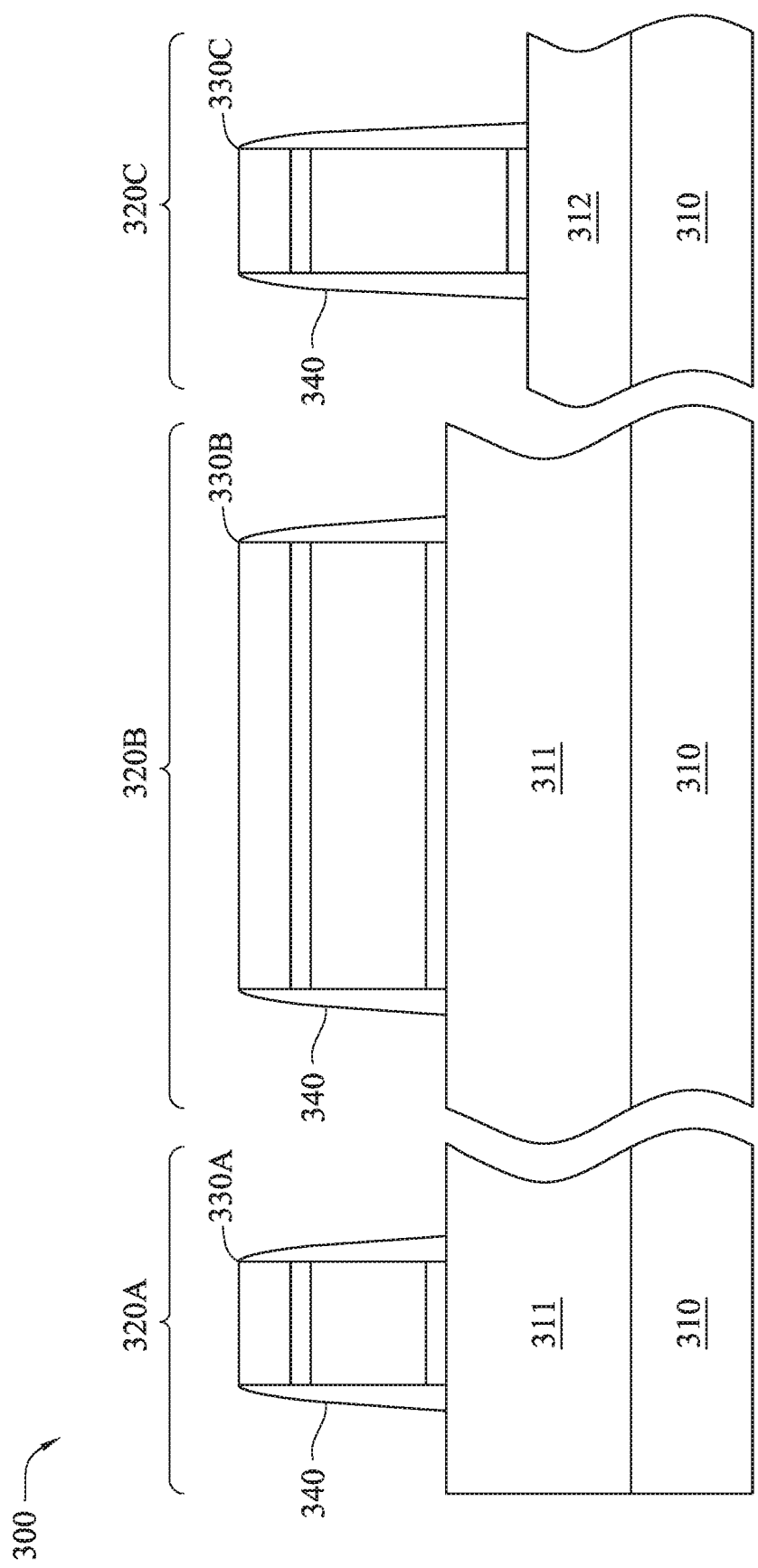

FIG. 3C is a cross-sectional view of semiconductor device 300 following operation 230. Spacers 340 are formed along sidewalls of gate stacks 330.

Figure 3D:
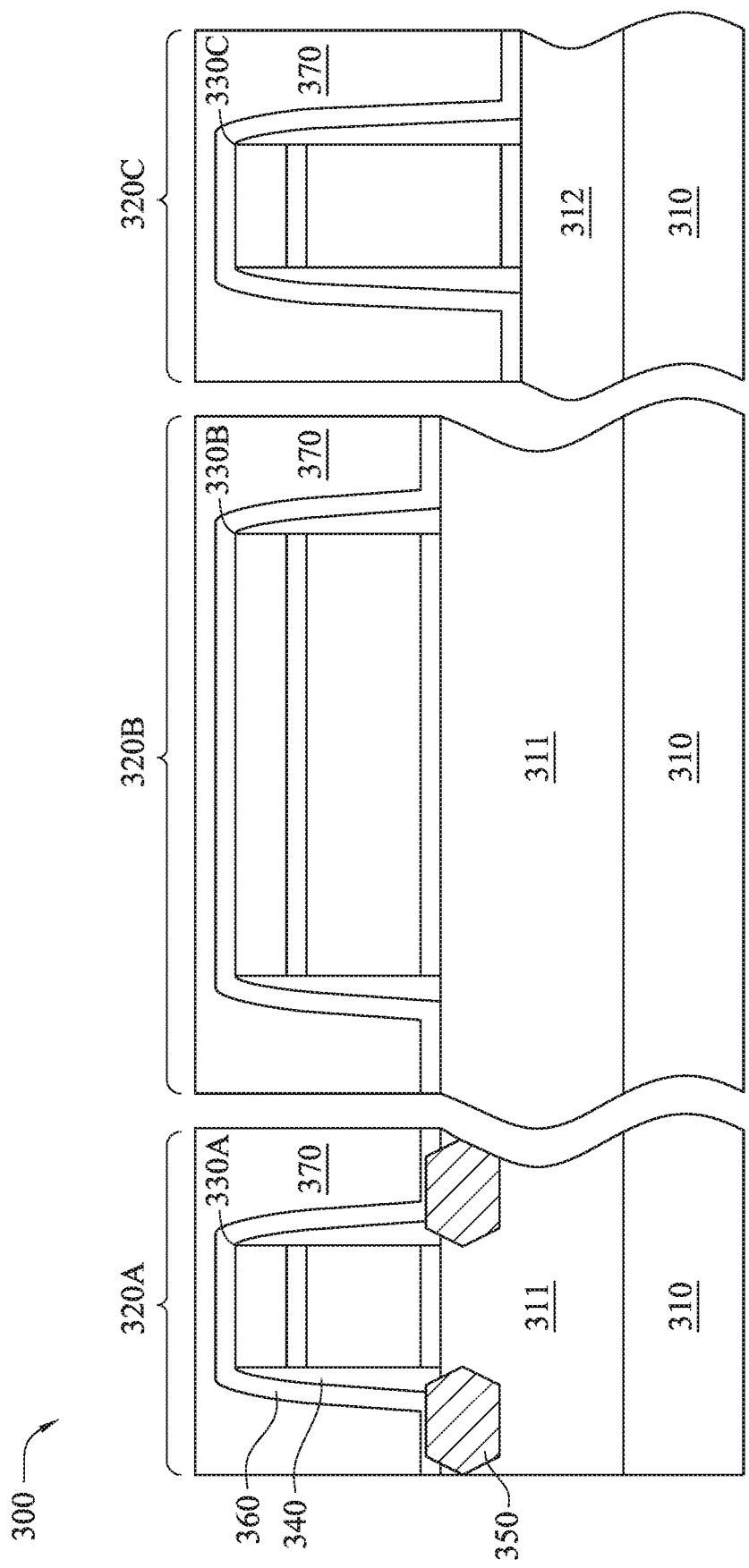

FIG. 3D is a cross-sectional view of semiconductor device 300 following operation 240. Source/drain features 350 are formed in fin structure 311. Semiconductor device 300 further includes an etch stop layer 360 and an ILD 370.

Figure 3E:
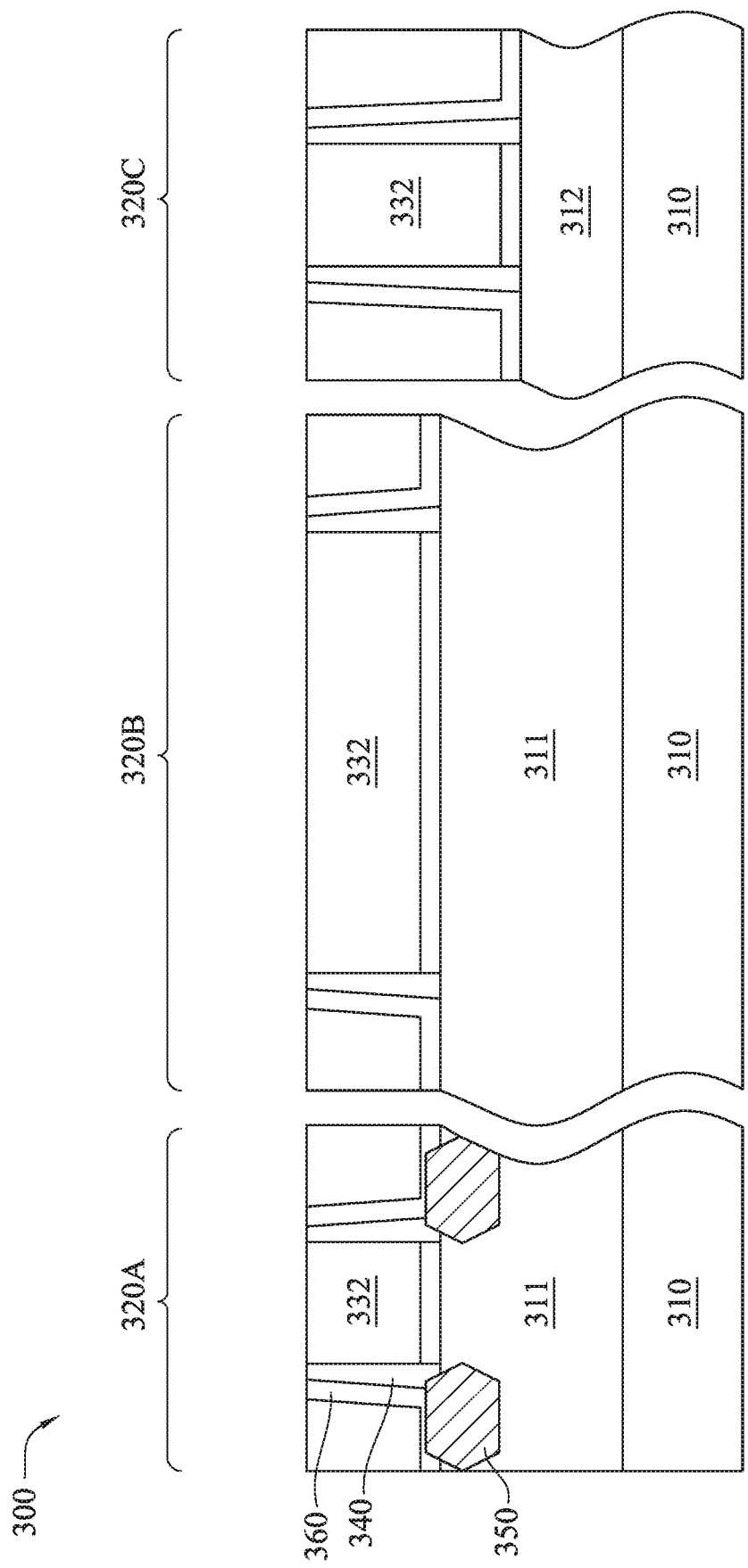
Figure 3F:
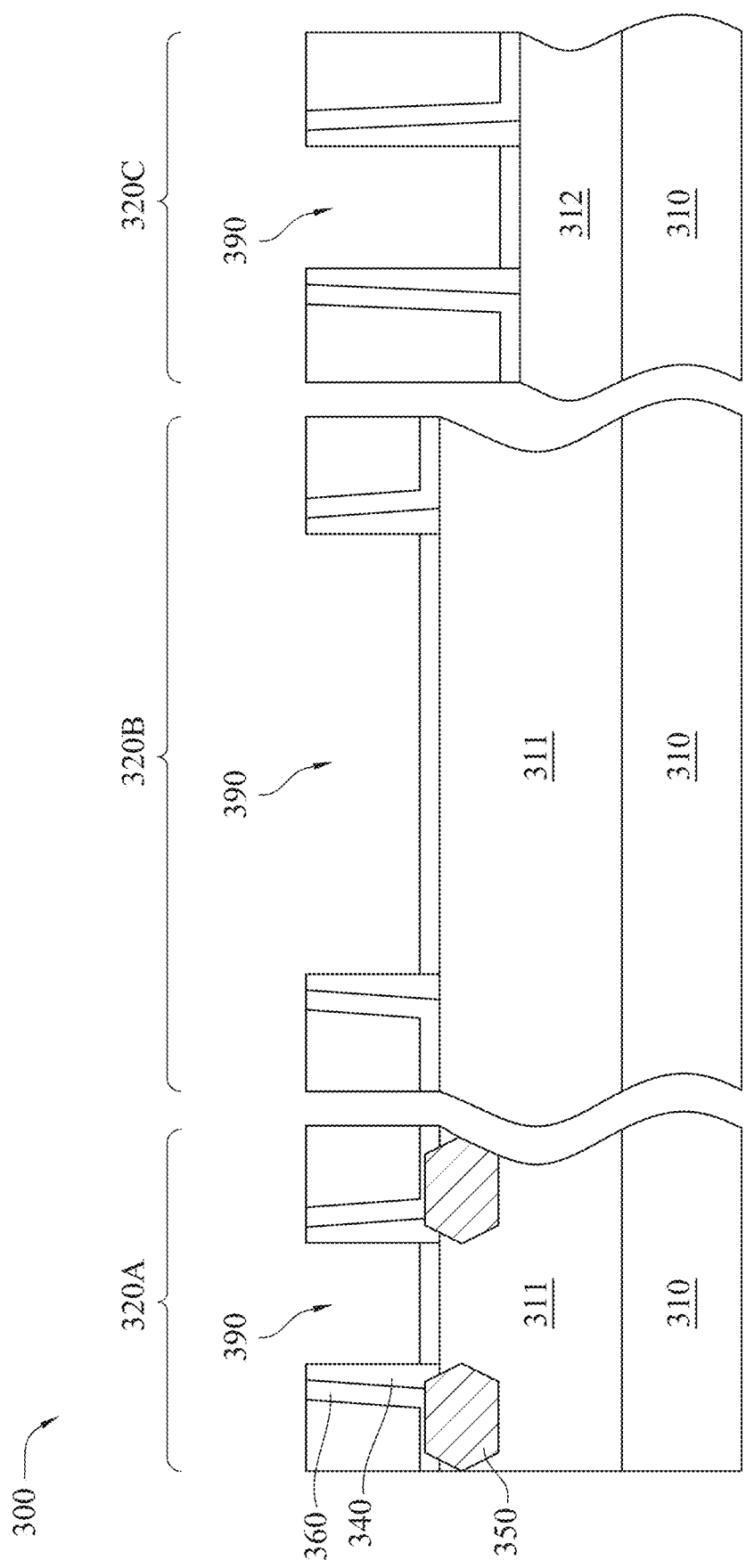

FIG. 3E is a cross-sectional view of semiconductor device 300 following operation 240. A planarization process is applied to expose silicon layer 332 and remove upper portions of spacers 340 and etch stop layer 360. In some embodiments, a contact opening is formed in ILD 370 and is then filled with a conductive material to form a contact plug. FIG. 3F is a cross-sectional view of semiconductor device 300 following operational operation 250. Silicon layer 332 is removed to form an opening 390 in ILD 370.

Figure 4:
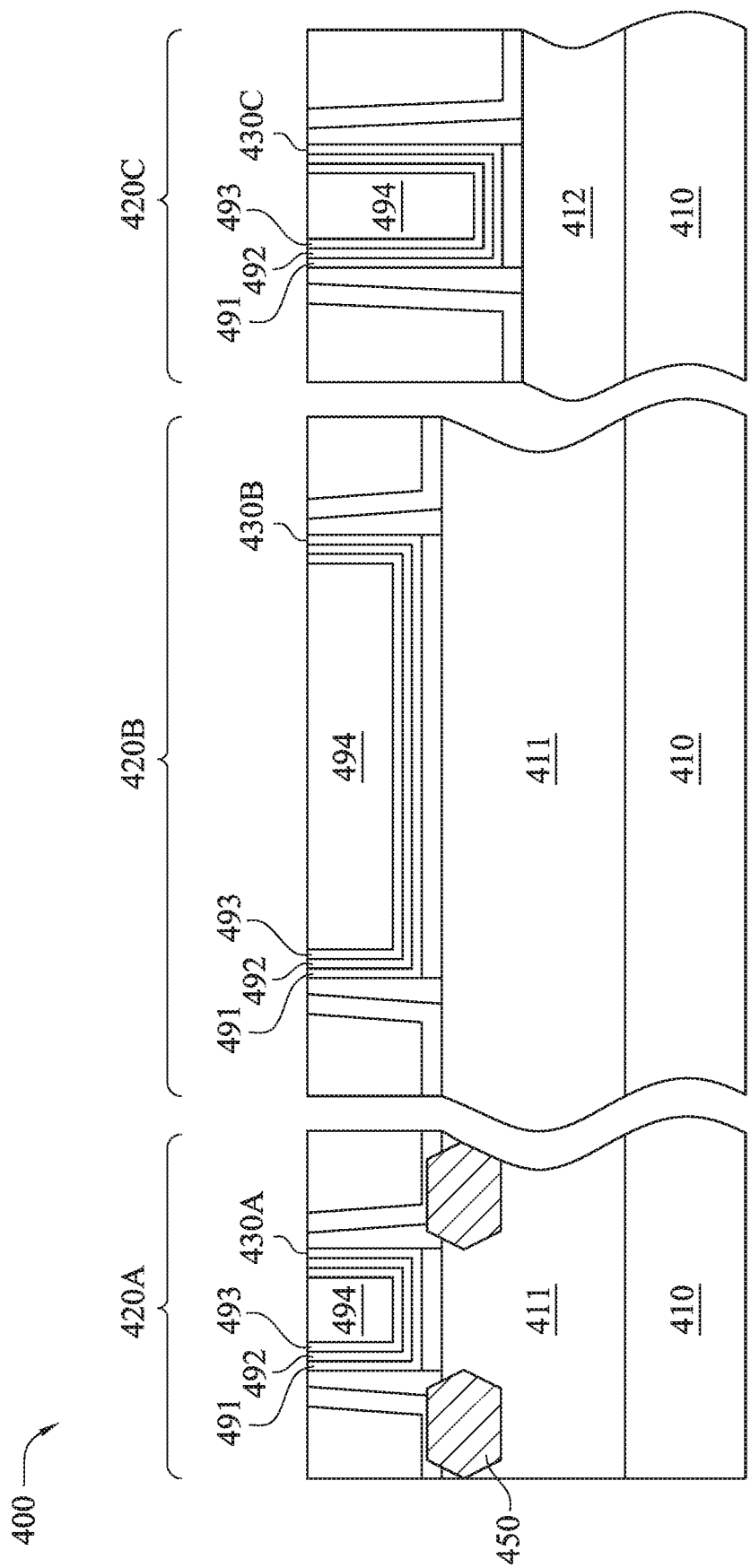
FIG. 4 is a cross-sectional view of a semiconductor device in accordance with one or more embodiments.

FIG. 4 is a cross-sectional view of a semiconductor device 400 in accordance with one or more embodiments. Semiconductor device 400 includes elements similar to semiconductor device 100 and a last two digits of like elements are the same. Semiconductor device 400 includes a first component 420A, a second component 420B and a third component 420C (collectively referred to as components 420). Each component 420 includes a gate stack 430A/B/C (collectively referred to as gate stack 430), and each gate stack 430 includes an interfacial layer 491, a high-k dielectric layer 492, a work function layer 493 and a metallic layer 494. In some embodiments, each gate stack 430 includes a same structural material to each other gate stack. In some embodiments, at least one gate stack 430 includes a different structural material to another gate stack.

Figure 5:
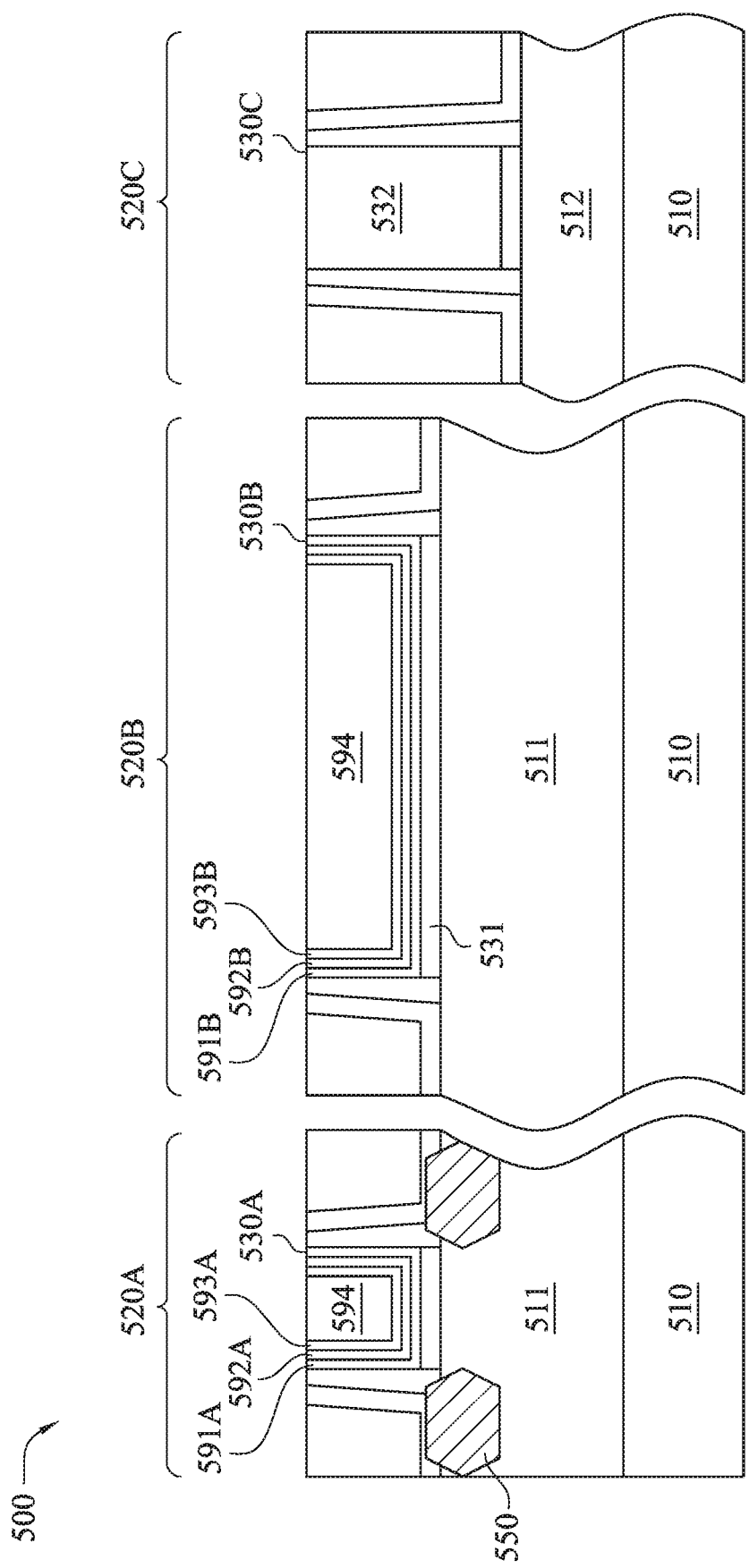
FIG. 5 is a cross-sectional view of a semiconductor device in accordance with one or more embodiments.

FIG. 5 is a cross-sectional view of a semiconductor device 500 in accordance with one or more embodiments. Semiconductor device 500 includes elements similar to semiconductor device 100 and a last two digits of like elements are the same. Semiconductor device 500 includes a first component 520A, a second component 520B and a third component 520C (collectively referred to as components 520). Each component 520 includes a gate stack 530A/B/C. In some embodiments, first component 520A is a field effect transistor and gate stack 530A includes a metallic layer 594; second component 520B is a capacitor where gate stack 530B and a fin structure 511 function as two electrodes and a gate dielectric layer 531 functions as an insulator; third component 520C is a resistor with a silicon layer 532. In some embodiments, gate stack 530B includes more or less layers than interfacial layer 591B, high-k dielectric layer 592B and work function layer 593B.

Figure 6:
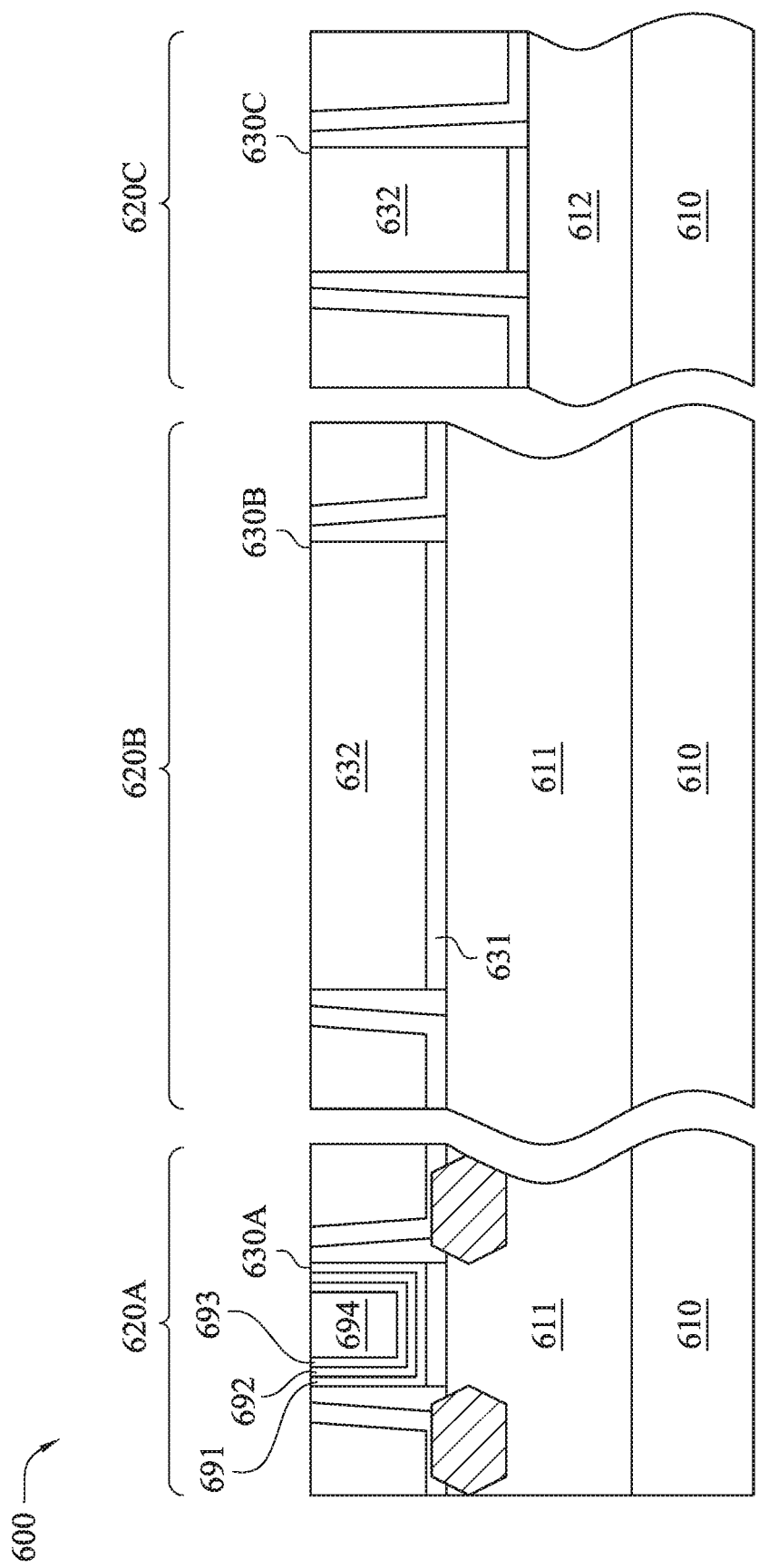
FIG. 6 is a cross-sectional view of a semiconductor device in accordance with one or more embodiments.

FIG. 6 is a cross-sectional view of a semiconductor device 600 in accordance with one or more embodiments. Semiconductor device 600 includes elements similar to semiconductor device 100 and a last two digits of like elements are the same. Semiconductor device 600 includes a first component 620A, a second component 620B and a third component 620C (collectively referred to as components 620). Each component 620 includes a gate stack 630A/B/C. Semiconductor device 600 includes a second component 620B. Second component 620B is a capacitor. Compared with semiconductor device 500, a silicon layer 632 and a fin structure 611 function as two electrodes and a gate dielectric layer 631 functions as an insulator. One of ordinary skill in the art would understand that based on the circuit design, in some embodiments, gate stack 630B includes silicon layer 632 while gate stack 630C includes a high-k layer and a metallic layer to form a high-k metal gate (HKMG) resistor.

Without the hydrogen treatment to induce the migration and coordinate silicon bonds, the voids generated from the silicon deposition process and/or the etch process result in the formation of protrusions during the spacers process. These protrusions will remain even after the gate replacement process. For a semiconductor structure with protrusions that cause variation in the silicon layer, the electrical properties of resultant devices will deviate from the designed electrical properties. Accordingly, by adding the hydrogen treatment, the deviation of electrical properties is minimized or avoided, resulting in an improved production yield.

One aspect of this description relates to a method of manufacturing a semiconductor structure. The method includes depositing a silicon layer over a substrate, removing a portion of the silicon layer to form a gate stack, and performing a hydrogen treatment on the gate stack to repair a plurality of voids in the stack structure.

Another aspect of this description relates to a method of manufacturing a semiconductor integrated circuit (IC). The method includes forming a dielectric layer over a fin structure, depositing an amorphous silicon layer over the dielectric layer, depositing a hard mask layer over the amorphous silicon layer, patterning the hard mask layer to form a first stack structure and a second stack structure, and performing a hydrogen treatment to the first stack structure and the second stack structure.

Still another aspect of this description relates to an IC device. The IC device includes a gate stack over a fin structure. The gate stack has a dielectric layer and a metallic layer. The IC device further includes spacers along sidewalls of the gate stack. An interface between the spacers and the dielectric layer is substantially free of silicon nitride protrusions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
depositing a silicon layer over a substrate;
depositing a dielectric layer over the silicon layer;
removing a portion of the silicon layer and the dielectric layer to form a gate stack, wherein the gate stack includes the dielectric layer over the silicon layer;
performing a hydrogen treatment on the gate stack, wherein the hydrogen treatment is configured to induce a migration of silicon atoms, and the hydrogen treatment is performed at a temperature of about 400 degrees Celsius;
forming spacers along sidewalls of the gate stack following performing the hydrogen treatment; and
removing the gate stack following the hydrogen treatment, wherein removing the gate stack comprises removing the entirety of the silicon layer.

2. The method of claim 1, wherein performing the hydrogen treatment comprises:
raising a chamber temperature to a temperature ranging from about 400 degrees Celsius to about 1200 degrees Celsius.

3. The method of claim 1, wherein performing the hydrogen treatment comprises:
adjusting a chamber pressure to a pressure ranging from about 50 Torr to about 760 Torr.

4. The method of claim 1, wherein performing the hydrogen treatment comprises:
treating the gate stack for a duration ranging from about 5 seconds to about 1 hour.

5. The method of claim 1, wherein depositing the silicon layer comprises:
depositing an amorphous silicon layer or a polysilicon layer over the substrate.

6. The method of claim 1, wherein performing the hydrogen treatment comprises:

performing the hydrogen treatment in an atmosphere containing about 1% to about 10% of a hydrogen-containing gas.

7. The method of claim 1, wherein performing the hydrogen treatment comprises:
exposing the gate stack to hydrogen, triatomic hydrogen or silane(s).

8. The method of claim 1, wherein performing the hydrogen treatment comprises:
raising a chamber temperature to a temperature of about 400 degrees Celsius.

9. The method of claim 1, further comprising:
depositing an inter-layer dielectric (ILD) over the gate stack, the spacers and the substrate;
wherein the removing of the gate stack forms an opening in the ILD; and
filling the opening with a dielectric material and a metallic material.

10. The method of claim 1, further comprising:
adding germanium atoms during the depositing of the silicon layer.

11. A method of manufacturing a semiconductor integrated circuit (IC), comprising:
forming a dielectric layer over a fin structure;
depositing an amorphous silicon layer over the dielectric layer;
depositing a hard mask layer over the amorphous silicon layer;
patterning the hard mask layer;
removing a portion of the amorphous silicon layer and a portion of the dielectric layer to form a first stack structure and a second stack structure;
performing a hydrogen treatment on the first stack structure and the second stack structure, wherein the hydrogen treatment includes an annealing process or a plasma process, the hydrogen treatment is configured to induce a migration of silicon atoms, and the hydrogen treatment is performed at a temperature of about 400 degrees Celsius;
removing at least one of the first stack structure or the second stack structure following the hydrogen treatment, wherein removing the at least one of the first stack structure or the second stack structure comprises removing the entirety of the amorphous silicon layer;
performing the hydrogen treatment with the hard mask layer over the first stack structure; and
forming spacers along sidewalls of the first stack structure after performing the hydrogen treatment.

12. The method of claim 11, wherein performing the hydrogen treatment comprises:
performing a hydrogen thermal annealing treatment at a temperature ranging from about 400 degrees Celsius to about 1200 degrees Celsius for a duration ranging from about 5 seconds to about 1 hour.

13. The method of claim 11, wherein performing the hydrogen treatment comprises:
performing a hydrogen plasma treatment at a radio frequency (RF) power ranging from about 200 watts to about 800 watts for a duration ranging from about 5 seconds to about 300 seconds.

14. The method of claim 11, further comprising:
depositing the amorphous silicon layer over an isolation feature; and
removing another portion of the amorphous silicon layer and another portion of the dielectric layer to form a third stack structure.

15. The method of claim 14, further comprising:
forming source/drain features at opposite sides of the first stack structure, wherein opposite sides of the second stack structure and opposite sides of the third stack structure are free of source/drain features.

16. The method of claim 14, further comprising:
forming an etch stop layer over the first stack structure, source/drain features between the first stack structure and the second stack structure, the second stack structure, and the third stack structure;
depositing an inter-layer dielectric (ILD) over the etch stop layer; and
planarizing the dielectric layer.

17. The method of claim 16, further comprising:
removing the first stack structure from the ILD to form a first opening; and
filling the first opening with a dielectric layer and a conductive layer.

18. The method of claim 16, further comprising:
removing the second stack structure from the ILD to form a second opening; and
filling the second opening with a dielectric layer and a conductive layer.

19. The method of claim 16, further comprising:
removing the third stack structure from the ILD to form a third opening; and
filling the third opening with a dielectric layer and a conductive layer.

20. A method of manufacturing a semiconductor structure, comprising:
depositing a silicon layer over a substrate;
depositing a plurality of dielectric layers over the silicon layer;
removing a portion of the silicon layer to form a gate stack, wherein the gate stack includes the plurality of dielectric layers;
performing a hydrogen treatment on the gate stack including the plurality of dielectric layers, wherein the hydrogen treatment reduces voids in the gate stack, and the hydrogen treatment is performed at a temperature of about 400 degrees Celsius;
forming spacers along sidewalls of the gate stack after performing the hydrogen treatment; and
removing the entirety of the silicon layer in the gate stack to define an opening between the spacers.

* * * * *